United States Patent
Reinders et al.

(10) Patent No.: US 10,877,077 B2
(45) Date of Patent: Dec. 29, 2020

(54) SYSTEMS AND METHODS FOR DETERMINING INPUT CURRENT OF A POWER DISTRIBUTION UNIT

(71) Applicant: SCHNEIDER ELECTRIC IT CORPORATION, West Kingston, RI (US)

(72) Inventors: Mark Vincent Reinders, Creve Coeur, MO (US); Ross Everett Dozier, Wildwood, MO (US); Daniel J. Rohr, Wildwood, MO (US); Anthony Matthew Mueller, Fenton, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 28 days.

(21) Appl. No.: 15/108,016

(22) PCT Filed: Dec. 26, 2013

(86) PCT No.: PCT/US2013/077771
§ 371 (c)(1),
(2) Date: Jun. 24, 2016

(87) PCT Pub. No.: WO2015/099726
PCT Pub. Date: Jul. 2, 2015

(65) Prior Publication Data
US 2016/0327595 A1 Nov. 10, 2016

(51) Int. Cl.
*G01R 19/02* (2006.01)
*G01R 21/133* (2006.01)
(Continued)

(52) U.S. Cl.
CPC .......... *G01R 19/02* (2013.01); *G01R 19/10* (2013.01); *G01R 21/133* (2013.01); *G06F 1/26* (2013.01); *G06F 1/28* (2013.01); *H02J 3/00* (2013.01)

(58) Field of Classification Search
CPC ...... G01R 19/02; G01R 19/10; G01R 21/133; G06F 1/26; G06F 1/28; H02J 3/00
See application file for complete search history.

(56) References Cited

U.S. PATENT DOCUMENTS

| | | | | |
|---|---|---|---|---|
| 5,422,567 A | * | 6/1995 | Matsunaga | A61B 18/1206 324/142 |
| 6,191,676 B1 | * | 2/2001 | Gabor | H02M 1/4225 336/160 |

(Continued)

OTHER PUBLICATIONS

Network Technologies Incorporated. Clearance Intelligent Power Distribution Control Units. Oct. 12, 2007. [retrieved on Mar. 27, 2014]. Retrieved from Internet: <URL http://www.networktechinc.com/remote-power.html>. entire document.

(Continued)

*Primary Examiner* — Jeff W Natalini
(74) *Attorney, Agent, or Firm* — Lando & Anastasi, LLP (57) ABSTRACT

According to various aspects and embodiments, a power distribution unit (PDU) is provided. The power distribution unit includes an input configured to receive input power, a plurality of outputs each coupled to the input and configured to receive input power, and each output of the plurality of outputs having an output configured to provide output power, and a controller coupled to the plurality of outputs and configured to determine a plurality of time intervals based on a frequency of the input power, measure a current at each time interval of the plurality of time intervals for each output of the plurality of outputs, generate a plurality of current measurement sums based on current measurement (Continued)

values associated with each time interval of the plurality of time intervals, and determine a root-mean-square (RMS) value based on the plurality of current measurement sums.

18 Claims, 8 Drawing Sheets

(51) Int. Cl.
*G06F 1/26* (2006.01)
*G01R 19/10* (2006.01)
*G06F 1/28* (2006.01)
*H02J 3/00* (2006.01)

(56) References Cited

U.S. PATENT DOCUMENTS

| | | | |
|---|---|---|---|
| 2005/0203987 A1* | 9/2005 | Ewing | G06F 1/26 709/200 |
| 2009/0085573 A1* | 4/2009 | Blakely | G01R 15/202 324/509 |
| 2009/0234512 A1* | 9/2009 | Ewing | H04L 12/10 700/295 |
| 2012/0236471 A1 | 9/2012 | Vinken et al. | |
| 2013/0289789 A1 | 10/2013 | Ewing et al. | |

OTHER PUBLICATIONS

Notification of Transmittal of the International Search Report and the Written Opinion of the International Searching Authority from corresponding PCT/US2013/077771 dated Apr. 21, 2014.

* cited by examiner

SYSTEMS AND METHODS FOR DETERMINING INPUT CURRENT OF A POWER DISTRIBUTION UNIT

CROSS-REFERENCE TO RELATED APPLICATIONS

This application is a U.S. National Stage Application under 35 U.S.C. § 371 of International Application No. PCT/US2013/077771, filed Dec. 26, 2013, titled SYSTEMS AND METHODS FOR DETERMINING INPUT CURRENT OF A POWER DISTRIBUTION UNIT, which is hereby incorporated herein by reference in its entirety.

BACKGROUND

Technical Field

Embodiments of the present disclosure relate generally to power measurement. More specifically, embodiments relate to systems and methods for measuring input current in power distribution units.

Background Discussion

Data centers often include multiple power distribution units (PDUs) contained within equipment racks. Rack-mounted power distribution units, sometimes referred to as rack PDUs, typically provide power to various devices such as servers and networking components contained within the equipment racks. It is often desirable to measure current or voltage used by various devices coupled to outputs (load-paths) of a PDU or a rack PDU.

Traditional PDUs found in data centers supply power to equipment through power outlets. A group of outlets may be protected by a circuit breaker and is commonly known as a bank. An RMS current value for an input of a PDU is generally measured by a current measurement sensor and associated circuitry. For example, a Current Transformer (CT) is commonly used to monitor current, power and/or energy consumption from a source at an input of a PDU. A CT may be coupled to an input of a PDU and used to measure an RMS current by producing a reduced current signal, proportionate to the current in the branch, which may be further manipulated and measured. Additionally, CT's are also often used to measure the current through each output of a PDU.

SUMMARY

According to some embodiments, a power distribution unit (PDU) is provided. The power device includes an input configured to receive input power, a plurality of outputs each coupled to the input and configured to receive input power, and each output of the plurality of outputs having an output configured to provide output power, and a controller coupled to the plurality of outputs and configured to determine a plurality of time intervals based on a frequency of the input power, measure a current at each time interval of the plurality of time intervals for each output of the plurality of outputs, generate a plurality of current measurement sums based on current measurement values associated with each time interval of the plurality of time intervals, and determine a root-mean-square (RMS) value based on the plurality of current measurement sums.

In one embodiment, the PDU may further comprise a first timer coupled to the controller, and the controller may be further configured to reset the first timer responsive to detection of a zero crossing of a waveform of the input power, and determine the frequency of the input power based on a value of the first timer. In this embodiment, the controller may be further configured to associate the current to a time interval of the plurality of time intervals, the time interval being determined based on a scaled value of the first timer. In another embodiment, each output of the plurality of outputs may be sampled in a sequential fashion.

In one embodiment, the controller may be further configured to average at least one current measurement of the plurality of current measurement sums with at least one previous current measurement using a leaky average technique.

In one embodiment, the PDU may further comprise a memory, and the controller may be further configured to store the plurality of measurements in the memory in a two-dimensional array, wherein a first dimension of the two-dimensional array is an index corresponding to a plurality of output values, and wherein a second dimension of the two-dimensional array corresponds to the plurality of time intervals. In this embodiment, each time interval of the plurality of time intervals may include a measurement value pair, the measurement value pair including a measurement value and a status flag. In addition, the status flag may be configured to indicate if a measurement has been sampled, and the controller may be further configured to determine that a complete set of measurement values are available in the two-dimensional array based on a status of each status flag.

In one embodiment, each current measurement sum of the plurality of current measurement sums may be based on summing a measurement value corresponding to each output of the plurality of outputs at a time interval. In this embodiment, the RMS value may approximate a current value for the input based on performing an RMS calculation using the plurality of current measurement sums. In another embodiment, the controller may be further configured to display the RMS value.

According to another embodiment, a method for determining a root-mean-square (RMS) value for an input of a power distribution unit (PDU) having a plurality of outputs is provided. The method includes acts of determining a plurality of time intervals based on a frequency of an input power coupled to the input, measuring a current at each time interval of the plurality of time intervals for each output of the plurality of outputs, generating a plurality of current measurement sums based on current measurement values associated with each time interval of the plurality of time intervals, and determining a root-mean-square (RMS) value based on the plurality of current measurement sums.

The method may further include acts of resetting a first timer responsive to detection of a zero crossing of a waveform of the input power, and determining the frequency of the input power based on a value of the first timer.

The method may further include acts associating the measured current for each output of the plurality of outputs to a time interval of the plurality of time intervals, the time interval being determined based on a scaled value of the first timer. In one embodiment, measuring a current at each time interval of the plurality of time intervals for each output of the plurality of outputs may further include measuring each output of the plurality of outputs in a sequential fashion. In addition, determining the root-mean-square (RMS) value based on the plurality of current measurement sums may further include summing a measurement value corresponding to each output of the plurality of outputs at each time interval of the plurality of time intervals to derive the plurality of current measurement sums and performing an RMS calculation on the plurality of current measurement sums to approximate the RMS value for the input.

According to another embodiment a non-transitory computer readable medium storing sequences of instructions executable by at least one processor is provided, the sequences of instructions instructing the at least one processor to execute a process for determining a root-mean-square (RMS) value for an input of a power distribution unit (PDU). The PDU including a plurality of outputs, the sequences of instructions including instructions configured to determine a plurality of time intervals based on a frequency of an input power, measure a current at each time interval of the plurality of time intervals for each output of the plurality of outputs, generate a plurality of current measurement sums based on current measurement values associated with each time interval of the plurality of time intervals, and determine the RMS value based on the plurality of current measurement sums.

In one embodiment, the current may be stored in a memory in a two-dimensional array, wherein a first dimension of the array is an index corresponding to an output of the plurality of outputs, and wherein a second dimension of the array corresponds to a time interval of the plurality of time intervals.

In one embodiment, the instructions are further configured to determine a complete set of measurement values are available within the two-dimensional array, sum each measurement value of the complete set of measurement values to derive a plurality of current measurement sums corresponding to a time interval of the plurality of time intervals, store the plurality of current measurement sums in a composite waveform array, and determine the RMS value based on the composite waveform array. In another embodiment, the instructions are further configured to display the RMS value.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed subject matter. Particular references to examples and embodiments, such as "an embodiment," "an other embodiment," "some embodiments," "other embodiments," "an alternate embodiment," "various embodiments," "one embodiment," "at least one embodiments," "this and other embodiments" or the like, are not necessarily mutually exclusive and are intended to indicate that a particular feature, structure, or characteristic described in connection with the embodiment or example and may be included in that embodiment or example and other embodiments or examples. The appearances of such terms herein are not necessarily all referring to the same embodiment or example.

Furthermore, in the event of inconsistent usages of terms between this document and documents incorporated herein by reference, the term usage in the incorporated references is supplementary to that of this document; for irreconcilable inconsistencies, the term usage in this document controls. In addition, the accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, the traditional approach to measuring an input RMS current within a PDU includes using a CT coupled to an input of the PDU. Generally, a cable is routed from the CT to a circuit board where a measurement integrated circuit (IC) resides. The density of components within the PDU may require the cable to have extra shielding, and thus, take up more space within the PDU. Space available to route the output wiring, cable, associated circuit board, and measurement IC is typically limited within a PDU.

Each measurement IC used to interface to the CT typically requires a burden resistor to convert the output of the CT into a voltage signal proportional to the current through the output of the circuit breaker (the bank current) that feeds the bank outlet. The combination of the CT, the burden resistor, and the measurement IC requires calibration. Calibration is typically performed during unit assembly at the factory and is completed by placing a known load on the bank outlets. The use of a measurement IC and associated circuitry along with factory calibration undesirably adds cost to the production of a PDU.

Some embodiments disclosed herein include a PDU in which an input RMS current of a PDU is determined without the necessity of a CT coupled to the input of the PDU. In some embodiments, instantaneous currents are sampled from two or more outputs of the PDU at identical intervals over one full line cycle (e.g., 64 times per full cycle, or 32 times per half cycle). An aggregated set of measurements from each output at each interval is stored by the PDU. In one embodiment, each aggregated set of measurements is stored in an array. A composite waveform is generated by summing each aggregated set of measurements for each interval. As a result, each interval may be represented by a single current value and stored in a one-dimensional array, referred to herein as a composite waveform array. Because the composite waveform array includes a complete set of summed current measurements for each interval across each sampled output, differences in output current phase relationships (e.g., due to non-linear loads) are accounted for. In various aspects and embodiments, the composite waveform array is utilized to determine the input RMS current for the PDU based on RMS calculations.

Figure 1:
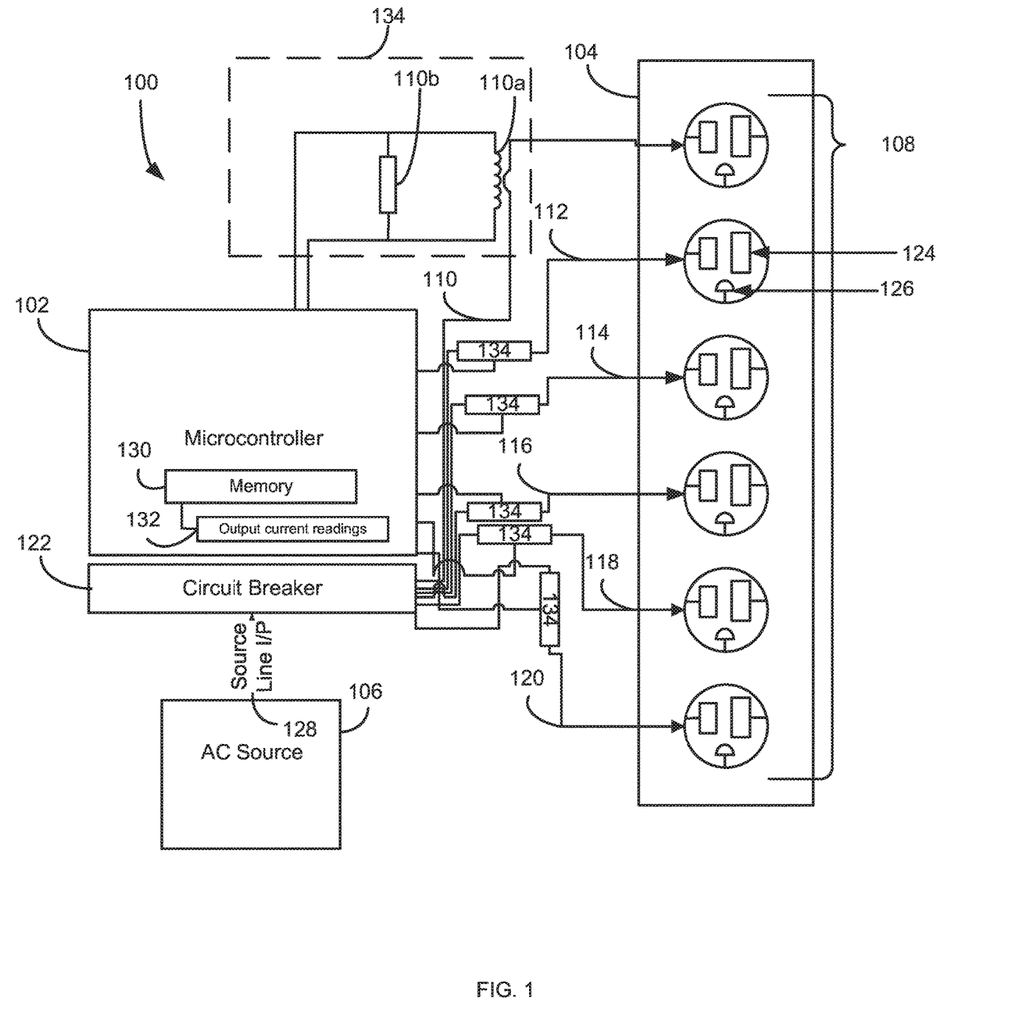
FIG. 1 illustrates one embodiment of a system for measuring current through multiple outputs according to aspects of the present disclosure.

FIG. 1 illustrates one embodiment of a system 100 for computing an input RMS current by measuring current across multiple outputs. The system 100 includes a microcontroller 102, a bank of outputs 104, an AC source 106, and a circuit breaker 122. The bank of outputs 104 includes receptacles 108, and outputs 110, 112, 114, 116, 118, and 120. Each output includes a CT 134. Each CT 134 includes a coil 110a and a burden resistor 110b. Each CT 134 is coupled to the microcontroller 102 which is configured to perform current measurements.

The AC source 106 is coupled to an input line 128. The circuit breaker 122 is coupled to each of the outputs 110, 112, 114, 116, 118, and 120. Each of the outputs 110, 112, 114, 116, 118, and 120 is coupled to a neutral line 124 and a ground 126. In the shown embodiment, six outputs are coupled to the circuit breaker 122. In other embodiments, the number of circuit breakers and associated outputs may be different.

As discussed above, the microcontroller 102 may be coupled to a CT 134 which is configured to measure an instantaneous current for each of the outputs 110, 112, 114, 116, 118, and 120. As discussed below with reference to FIG. 3, the microcontroller 102 may also be configured to determine the zero-crossing of a source AC voltage. In one embodiment, the microcontroller is a PIC18F4680 available from Microchip of Chandler, Ariz.

The microcontroller 102 further includes a memory 130 configured to store a set of output current readings 132. The set of output current readings 132 may be configured in memory as a two-dimensional array. A first array dimension may correspond to a number of outputs that make up the bank (e.g., 6) while a second dimension may correspond to a number of time intervals at which output currents are sampled. Each array element of the second dimension may be configured as a pair of values with a first value corresponding to an output current measurement reading and a second value corresponding to a status flag. The status flag may be a binary value with a "0" indicating a NO_READING condition and a "1" indicating an OK_READING condition. The structure and values within the output current readings 132 is discussed further below with reference to FIG. 5.

The system 100 allows for determination of an input RMS current without a traditional hardware based sensing device such as a CT coupled between the AC source 128 and the circuit breaker 122. By sampling the individual outputs in accordance with the subroutines of FIGS. 3, 4, 6 and 7, discussed below, it is possible to determine an input RMS current regardless of phase relationships and whether the outputs 110-120 are coupled to non-linear loads.

The AC source 106 may be an external AC power source (e.g., such as a utility AC power source). AC power supplied by the AC source 106 may be provided to the circuit breaker 122 via the input line 128. The AC power is then provided via outputs 110, 112, 114, 116, 118, and 120, to one or more loads coupled to the outlets 108.

Figure 2:
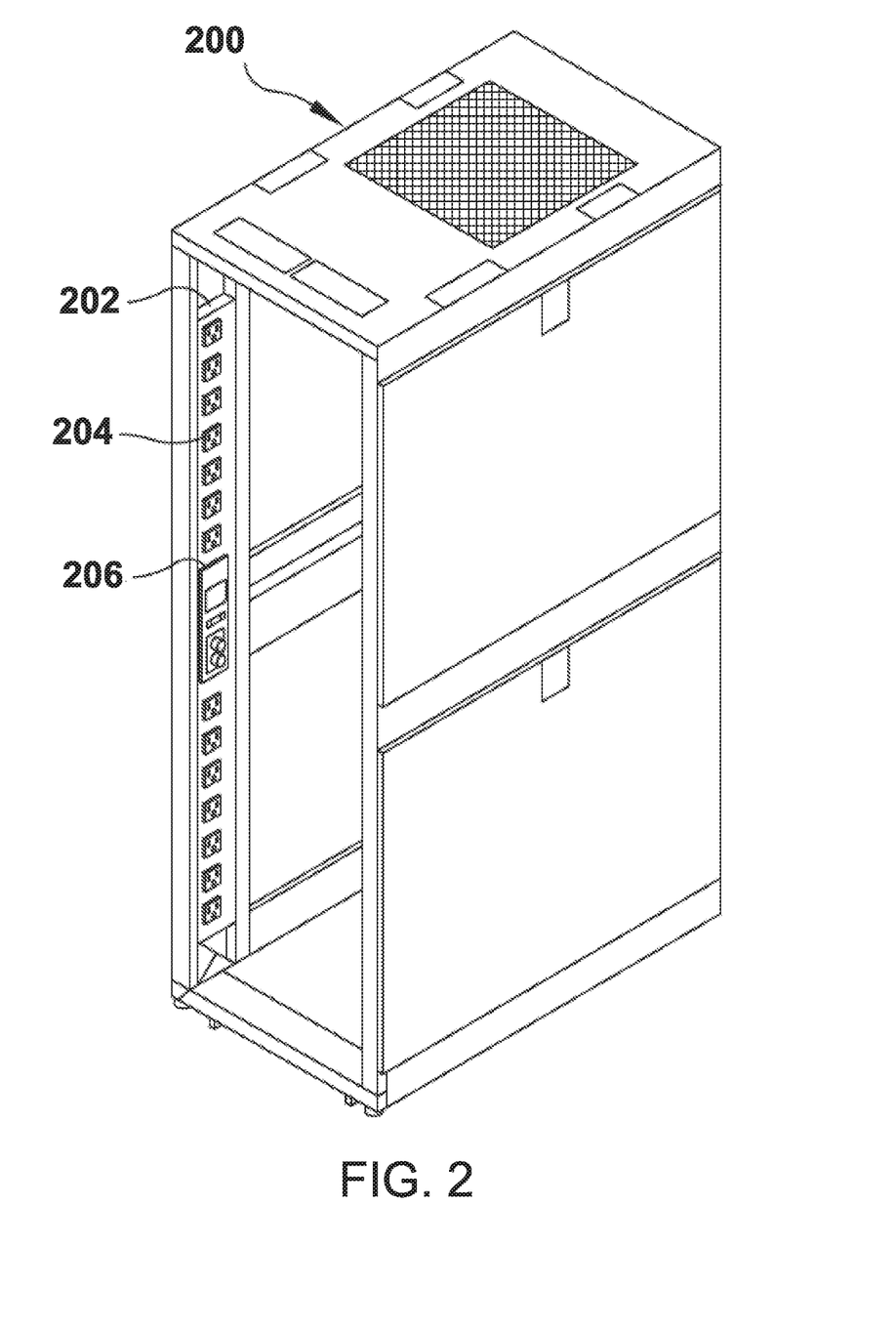
FIG. 2 illustrates a rack PDU including the system for measuring current through multiple outputs according to aspects of the present disclosure.

FIG. 2 illustrates a rack 200 configured to house one or more pieces of equipment such as data center equipment. The rack 200 houses a rack PDU 202 including a plurality of electrical outlets 204. The rack PDU 202 may be configured according to one or more aspects disclosed herein. The rack PDU 202 may include a measurement system 206 for measuring currents for one or more outputs 204. For example, the rack PDU 202 may include the system 100 of FIG. 1. The microcontroller 102 in the embodiment of FIG. 1 may be included in the measurement system 206 and may have one or more input and output channels, each being associated with a respective output 204 of the rack PDU 202. The current through each outlet 204 may be measured independently over a period of time with measurement values being stored in the output current readings 132.

Figure 3:
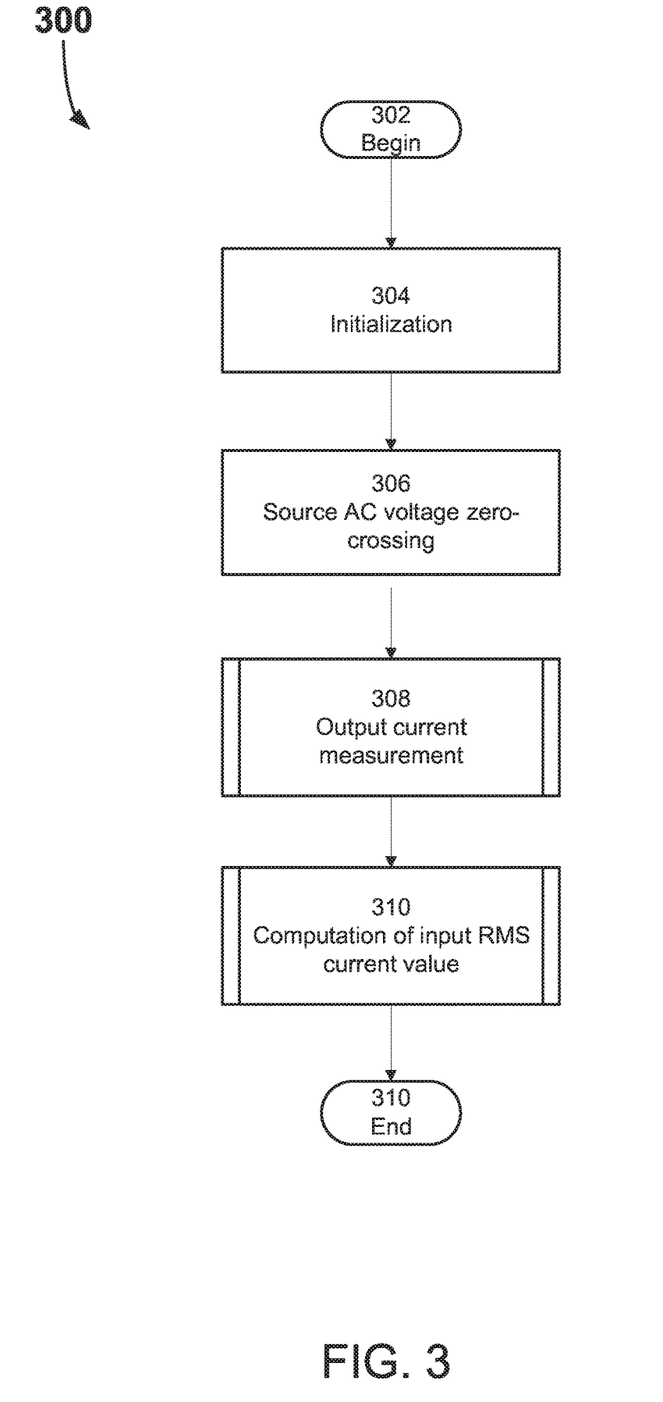
FIG. 3 is a flow diagram of one example of a method of measuring current through multiple outputs to determine an input RMS current value.

As described above with reference to FIG. 1, several embodiments perform processes which determine an input RMS current for a PDU. In some embodiments, these measurement processes are executed by a microcontroller, such as the microcontroller 102 described above with reference to FIG. 1 or the computer system 800 described below with reference to FIG. 8. FIG. 3 illustrates one example measurement process 300 executed by the system 100. The measurement process 300 begins in act 302.

At act 304, the system 100 (FIG. 1) performs an initialization routine. In one embodiment, the initialization routine includes configuring a timer which is utilized by the processes of FIGS. 4, 6 and 7 to determine a zero crossing of a voltage waveform for an AC power source as described below. In this embodiment, the timer may be configured with a set of pre-defined parameters. The pre-defined parameters may include a counter mode (e.g., count-up or count-down), a clock source, and a pre-scale value. For example, a 16-bit timer may utilize a 10 MHz clock source and be configured with a ⅛ pre-scale value. In this example, the 16-bit timer provides a high resolution count of the time intervals over one full line cycle (at 50 or 60 Hz) of outlet current. In other embodiments, the system 100 uses the microcontroller 102 to determine the power line frequency. In these embodiments, the microcontroller 102 monitors AC power at the input line 128 to determine a zero-crossing and an offset from the zero-crossing for each current reading sampled at an output.

In one embodiment, the initialization routine zeros out the output current readings 132. As discussed above with reference to FIG. 1, the output current readings 132 may be configured as a two-dimensional array. The first dimension may be configured as an integer value which represents a particular output. For example, output 110 (FIG. 1) may be represented by an index value of 0. Likewise, outputs 112-120 may be represented by an index value of 1-5, etc. In one embodiment, the second dimension of the two-dimensional array may be configured with a plurality of value pairs comprising an output current measurement reading and a binary status flag. In other embodiments, the second dimension of the two-dimensional array may be configured with a plurality of values comprising only the output current measurement readings. As discussed further below with reference to FIG. 5, each output current is stored in the output current readings 132 (FIG. 1) using a number format which enables the root mean square (RMS) current to be efficiently computed for the input of the PDU during the processes shown in FIGS. 6 and 7.

In act 306, the system 100 (FIG. 1) executes an AC voltage zero-crossing subroutine to determine the power line frequency (e.g., 50 or 60 Hz). In one embodiment, the system 100 starts the timer initialized in act 304 in a count-up mode from an initial value. Subsequent rising edge zero-crossings may result in the re-initialization of the timer, which in turns causes the timer to count up from an initial value. The initial value of the timer may be used as a reference to determine if zero crossings have been missed and an overflow condition has occurred. For example, if the system 100 determines the current timer value is less than the initial timer value (in a count-up mode) then the system 100 may determine a zero-crossing has been missed and an overflow condition has occurred. In another embodiment, the system 100 uses the microcontroller 102 to determine the power line frequency and zero-crossing for AC power at an input, such as the input line 128 of FIG. 1. In all of these embodiments, each current sampled from an output (e.g., outputs 112-120 of FIG. 1) may be correlated to a unique time interval based on the zero crossing. In subsequent calculations, a plurality of current measurements sampled across each output may be aligned (e.g., time-shifted) so that current measurements across each of the outputs lineup at the zero crossing. Accordingly, subsequent calculations during act 310, as discussed further below, may determine an RMS output current value regardless of whether output currents are out of phase (e.g., due to non-linear loading).

In act 308, the system 100 (FIG. 1) executes an output current measurement subroutine periodically. In one embodiment, instantaneous current measurements from each of the outputs 110-120 are collected (e.g., via the CT 134). In at least one embodiment, the period of time between executions of the output current measurement subroutine may be determined by the use of the timer initialized in act 304. In other embodiments, a different timer may be used. In one example, a period is configured such that each output current is measured (or sampled) often enough to capture a complete set of measurements representing an output waveform by associating samples within the output current readings 132 with time intervals. The time intervals may be referred to herein as "time buckets." In this example, a 16-bit timer with a ⅛ prescale would translate into 64 samples, or time buckets (65535/1024=64). This process continues until all of the outputs have been sampled. In other examples, the number of time buckets may be based on the microcontroller 102 determining a power line frequency.

In act 310, the system 100 (FIG. 1) executes a subroutine to determine an input RMS current. The subroutine may be executed at an interval which is longer than the period of the output current measurement subroutine of act 308 (e.g., to insure that all of the outputs have been sampled and have values within the time buckets). In one embodiment, the subroutine is executed one time per second. As discussed further below with reference to FIG. 6, the subroutine may determine if the output current readings 132 have a complete set of measurements prior to calculating a root mean square (RMS) current value for the input of the PDU.

Acts 306-310 of the measurement process 200 may be executed continuously throughout the operation of the system 100, or until a command is executed by the system 100 to suspend execution. The measurement process 200 ends in act 310.

Figure 4:
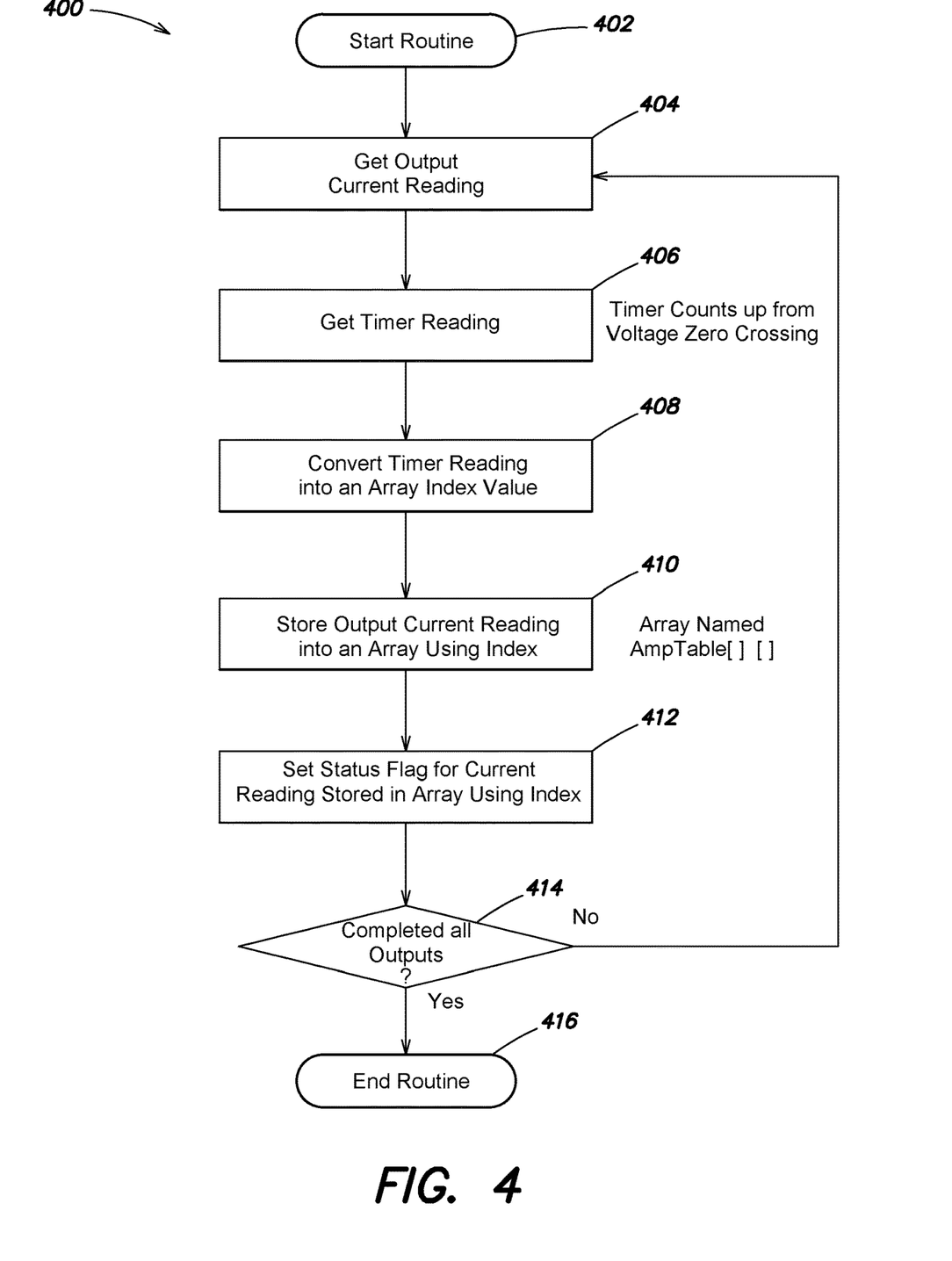
FIG. 4 is another flow diagram of one example of a method of measuring output current.

As discussed above with reference to act 308, some embodiments perform processes through which the system 100 (FIG. 1) executes an output current measurement subroutine. One example of an output current measurement subroutine 400 is illustrated in FIG. 4.

In act 404, an instantaneous current from each of the outputs 110-120 is sampled by the microcontroller 102 (FIG. 1). In one embodiment, the microcontroller 102 determines a current reading using a CT 134 coupled to an output. As discussed above with reference to FIG. 1, each output current reading is stored in memory using a number format which is used during subsequent computations to determine an input RMS current value. The current reading may be converted prior to storing the current reading in memory. For example, the current reading may be converted to tenths of an amp, hundredths of an amp, etc. In one embodiment, the current reading may be a data type such as a signed integer or floating point number. In this embodiment, the output current measurement may be a signed number to preserve the phase relationship needed when executing the subroutines of FIGS. 6 and 7.

In act 406, a timer value is retrieved from the timer initialized in act 304 of FIG. 3. As discussed above with reference to FIG. 3, at each instance in which the zero-crossing of an input signal is detected, the timer is re-initialized and begins to count up from an initial value. In act 406, the initial value is compared against a retrieved timer value. In one embodiment, a timer value which is greater than the initial value is an indication that the timer has not rolled over, and thus, valid measurements may be performed on an output.

In act 408, the timer value is converted into an array index. In one embodiment, the array index is computed based on the upper bits (i.e., most-significant bits) of the timer value. As discussed above with reference to FIG. 3, the array index is a "time bucket" which is used to store an output current measurement. In one example, a 16-bit timer may be divided by 1024 (e.g., ⅛ prescale) to form 64 discrete time buckets for storage of output current measurements. After a zero-crossing is detected, each measurement will correspond to a unique time bucket based on the index determined in the act 408. As discussed below with reference to FIG. 5, the unique time-buckets are used advantageously to sum current measurements across each output based on a sequence of time-buckets.

In at least one embodiment, the use of a timer is optional in acts 406 and 408. For instance, the system 100 may use the microcontroller 102 coupled to an input, such as input 128 of FIG. 1, to obtain an array index (i.e., an offset from a zero-crossing) for an output current measurement. In these embodiments, a "zero-crossing index" may be stored in the memory 130 (FIG. 1). The zero-crossing index may be used to determine which current measurement index in the output current readings 132 corresponds to the zero-crossing. Subsequent processes, such as the sub-routine 600 of FIG. 6 discussed further below, may utilize each zero-crossing index to align (e.g., time-shift) current measurements across a plurality of outputs.

In act 410, the current readings which were sampled in act 404 may be stored in the memory 130 of the microcontroller 102. As discussed above with reference to FIG. 1, the output current readings 132 may be stored in a two-dimensional array which is indexed based on individual outputs. Each output of the two-dimensional array is associated with N number of time buckets (e.g., 64) as determined by the initialization routine of act 304 (FIG. 3). Using the array index determined in act 408, the output current measurement is stored within the output current readings 132. In one embodiment, the stored measurement may be configured as a data type which is signed (e.g., signed integer, floating point decimal) in order to preserve the phase relationship for subsequent RMS computations. The structure and relationship of the current measurements stored within output current readings is discussed further below with reference to FIG. 5.

In act 412, a status flag may be set for the current reading acquired in act 404 and stored as a pair with the current reading in the output current readings 132. As discussed above with reference to FIG. 1, the status flag may be configured as a binary value. A binary value of "0" may represent a constant defined as NO_READING, and a binary value of "1" may represent a constant defined as OK_READING. As discussed below with reference to FIG. 6, the status flags may be used to determine if a complete set of measurements representing the entirety of a input current waveform of a PDU is stored within the output current readings 132 prior to performing an RMS computation process, such as the RMS computation process of FIG. 7. In other embodiments, the current reading is stored in the output current readings 132 without a status flag.

In act 414, the system 100 determines if all of the outputs have been sampled over one full line cycle. The output measurement subroutine 400 returns to act 404 and performs acts 406-412 until each output (e.g., outputs 110-120 of FIG. 1) has been sampled and is represented by a complete set of measurements in the output current readings 132.

In one embodiment, in act 414 a "leaky average" technique may be utilized to smooth out current readings within the output measurement values 132. For example, a portion of the measurement values (e.g., ⅛ of the measurements) within the output measurement values 132 may be averaged with a portion of previously measured current values (e.g., ⅞ of the previously measured current values). In this example, the system 100 may store a copy of the previously sampled output measurement values for purpose of mitigating the impact of low-level noise within the sampled AC signal. The output current measurement subroutine 400 ends at act 416.

Figure 5:
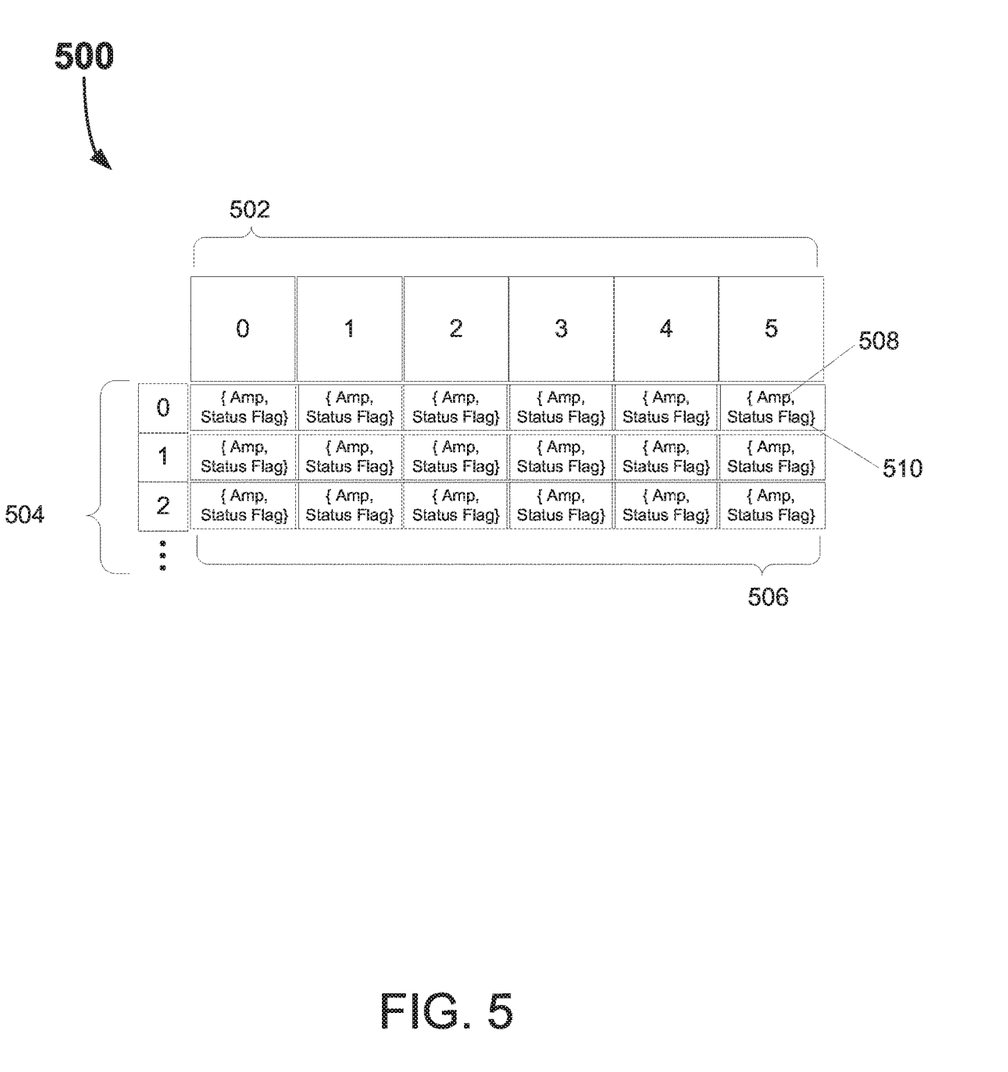
FIG. 5 illustrates one embodiment of output current readings in a tabular view.

Referring now to FIG. 5, illustrated is one embodiment of the output current readings 132 (FIG. 1) in a tabular view 500. The tabular view 500 includes output indexes 502, time buckets 504, and measurement pairs 506. Each measurement pair of the measurement pairs 506 includes a measurement value 508 and a status flag 510. In one embodiment, measurements stored in the output current readings 132 do not include a status flag (e.g., to conserve memory).

Figure 6:
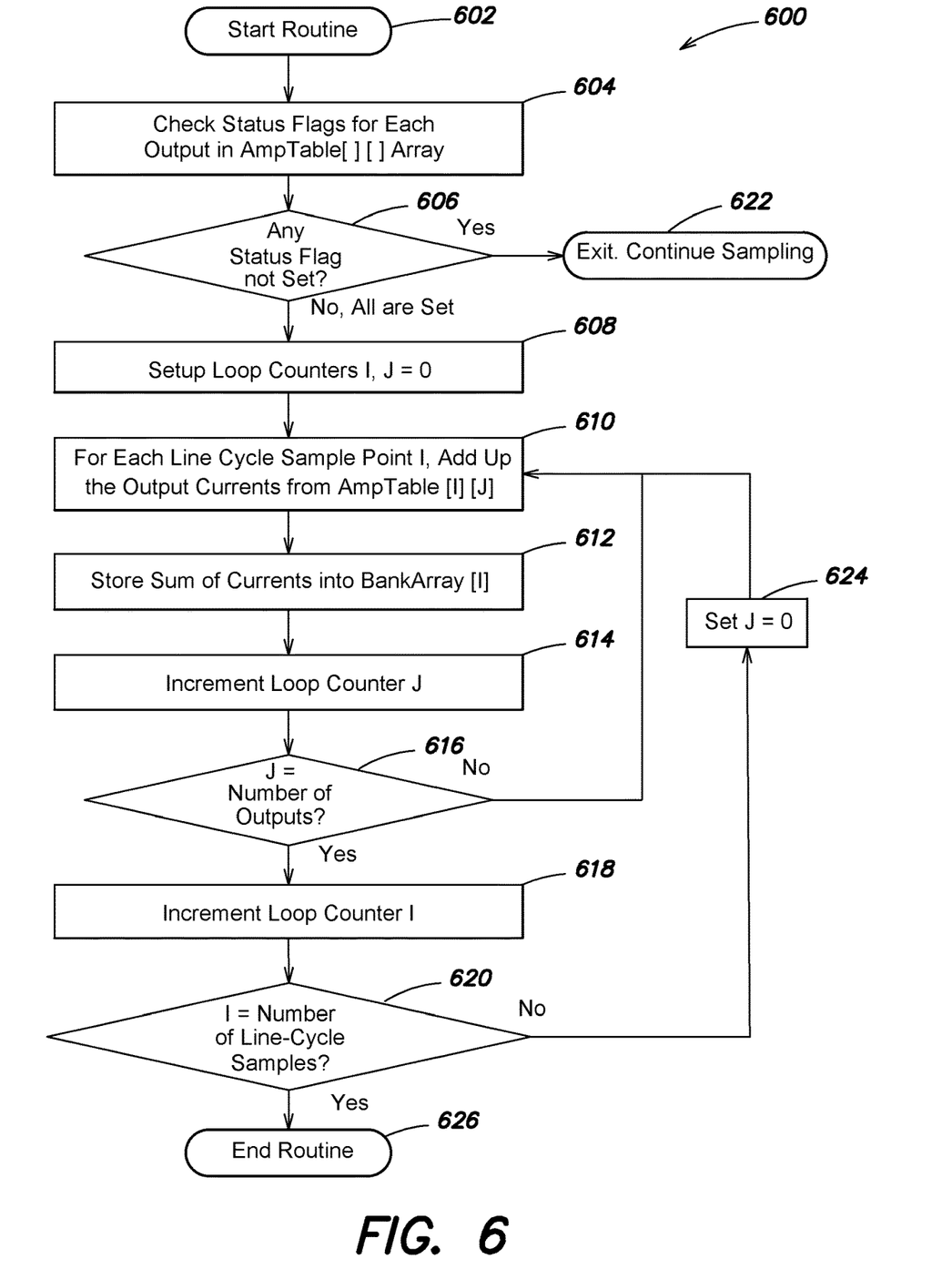
FIG. 6 is another flow diagram of one example of a method of summing output currents.
Figure 7:
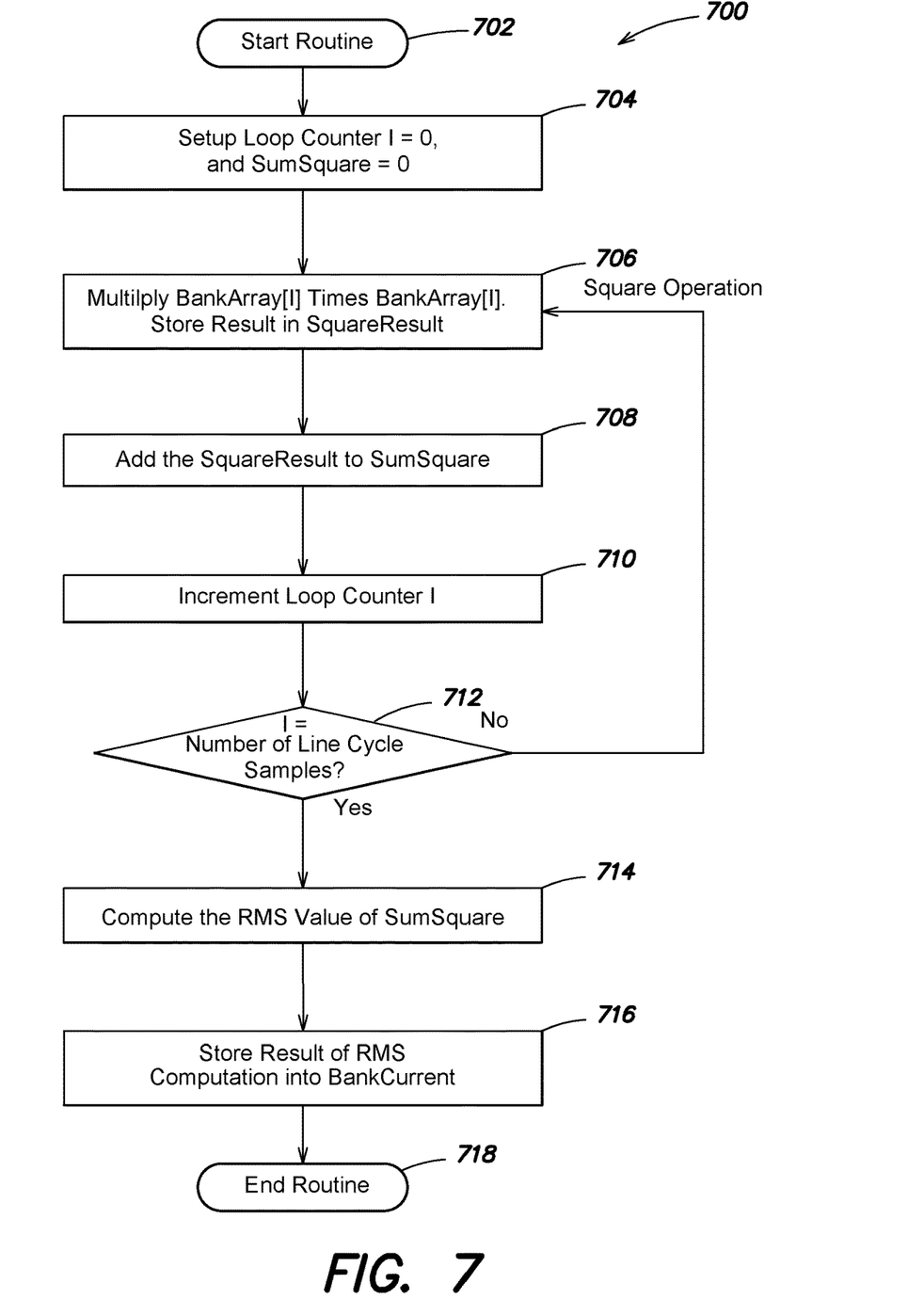
FIG. 7 is another flow diagram of one example of a method of determining an input RMS current value.

The time buckets 504 may be used by the processes of FIGS. 6 and 7 to compute an input RMS current value. In one embodiment, each time bucket 504 may be a unique value based on a timer counting up upon detection of the zero-crossing of a source signal. The upper bits (or most-significant bits) of a 16-bit timer may be used to define each time bucket. In this embodiment, a 16-bit timer with a 10 MHz may be divided by 1024 (i.e., a ⅛ prescale) enabling 64 time buckets for storing a representation of an input current waveform of a PDU. In some embodiments, a higher or lower frequency clock may be used to sample output current measurements. In other embodiments, each time bucket 504 may be a unique value based on the microcontroller 102 determining a power line frequency. Although the embodiment shown illustrates the tabular view 500 having three time buckets, other embodiments may include any number of time buckets based on the frequency of an AC power source determined in act 306 of FIG. 3.

In one embodiment, the status flag 510 indicates that a particular measurement has been performed for an output for a given time bucket. As discussed above in reference to act 304, the initialization routine zeros out the memory area in which the output current readings 132 are stored. A value other than zero, such as a binary one, may indicate to the processes of FIGS. 6 and 7 that a complete set of measurements is available for all outputs across all time buckets, such as the outputs 110-120 of FIG. 1.

As discussed above with reference to the act 310, some embodiments perform processes through which the system 100 (FIG. 1) executes a subroutine to determine an input RMS current of a PDU. One example of a sub-routine 600 to determine an input RMS current is illustrated in FIG. 6. The sub-routine 600 begins in act 602.

In act 604, the system 100 checks the status flag for each of the output measurement values stored within the output current readings 132. If any status flag is not set (e.g., NO_READ) then the subroutine exits in act 622 and returns to an output sampling subroutine, such as the output current measurement subroutine 400 of FIG. 4. If all status flags are set (e.g., all are OK_READING) then the sub-routine 600 continues to act 608.

In one embodiment, acts 606, 608 and 610 are optional. For instance, memory may be saved by not including a status flag. In this embodiment, the process continues directly from act 602 to act 608.

In act 608, a loop is configured with counters (I) and (J), representing outputs and time buckets, respectively. In act 610, a loop is executed wherein each measurement value corresponding to a time bucket (J) is summed. In one embodiment, current measurements in the output current readings 132 are aligned (time-shifted) based on a zero-crossing index of each output prior to summing Returning to FIG. 5, output current readings are illustrated in the tabular view 500. In this example, summation in accordance with acts 610-614 would include summing an entire row (e.g., the row corresponding to time bucket zero) of measurement values for a particular time bucket 504 across all outputs.

In act 612, the summation of the time bucket (J) is stored in a bank array. The summation may be indexed in the bank array based on the time bucket. In act 614, counter (J) is incremented and the loop continues until all of the output measurement values have been summed (e.g., (J) is equal to the number of outputs). If all of the output measurement values have been summed for a particular time bucket and stored in the bank array, the loop exits at act 616. In act 618, the time bucket counter (I) is incremented. In act 620, if counter (I) is equal to the number of time buckets the subroutine continues to act 626. If (I) is not equal to the number of time buckets, then the subroutine 600 continues to act 624 and resets counter (J) to zero. Once counter (J) has been reset to zero, the subroutine 600 performs acts 610-620 until all time buckets have been summed. In act 626, the subroutine 600 ends.

As discussed above with reference to FIG. 3, each summed value in the bank array of act 612 (FIG. 6) may be squared. One example of the squaring of each summed value is illustrated in the subroutine 700 of FIG. 7. The subroutine 700 begins in act 702.

In act 704 a loop is initialized. As discussed above with reference to FIG. 6, the bank array may be configured as a single-dimensional array which is indexed by time bucket values. In this way, the entirety of an input current waveform of a PDU may be represented by summed measurement values in each sequential time bucket of the bank array. In act 706, each element of the bank array is squared to result in a positive square value. In act 708, the resulting positive square value may then be stored in a square result array. In one embodiment, the square result array is a single-dimension array with a number of elements corresponding to a number of time buckets (e.g., 64). In act 710, a counter is incremented. In act 712, if it is determined that the counter value is equal to the number of time buckets, the subroutine 700 continues to act 714. If the counter value is not equal to the number of time buckets, the subroutine 700 continues to perform acts 706-712 until all values within the bank array have been squared (i.e., all time buckets have a positive value).

In act 714, the RMS value of the sum square array is determined. The sum square array contains a composite waveform representation of the PDU input current waveform, which may be processed using an RMS calculation. For example, using n values of the sum square array, the following equation may be used to determine an RMS current value for an input:

$$X_{rms} = \sqrt{\frac{1}{n}(x_1^2 + x_2^2 + \ldots + x_n^2)} \quad (1)$$

Where (X) is the resulting RMS value in Amps, (n) is the number of time buckets (e.g., samples) and (x) is the measurement value sampled corresponding to each time bucket.

In one embodiment, the resulting value may be converted to present the input RMS current for display, such as via a display device of the measurement unit 206 (FIG. 2). For example, the resulting value may be mathematically converted to tenths of amps, hundredths of amps, etc.

Processes 300, 400, 600 and 700 each depict one particular sequence of acts in a particular embodiment. Some acts are optional and, as such, may be omitted in accord with one or more embodiments. Additionally, the order of the acts can be altered, or other acts can be added, without departing from the scope of the embodiments described herein.

One or more features disclosed herein may be implemented in one or more PDUs or rack PDUs. In other embodiments, various aspects and functions described herein may be implemented in one or more apparatuses separate from a PDU or a rack PDU. An apparatus configured according to one or more features disclosed herein may be configured to couple to a PDU or a rack PDU to allow measurement of dynamic signals.

Figure 8:
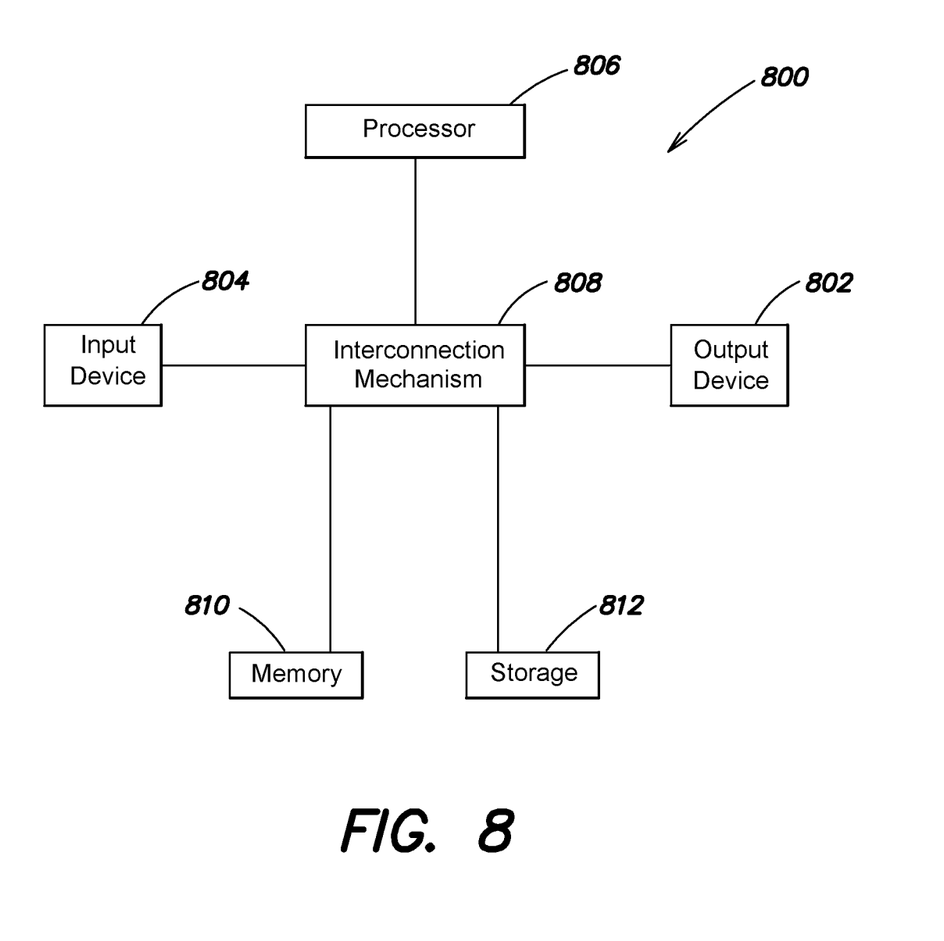
FIG. 8 is a block diagram of one example of a computer system upon which various aspects of the present embodiments may be implemented.

Furthermore, various aspects and functions described herein in accord with the present disclosure may be implemented as hardware, software, firmware or any combination thereof. Aspects in accord with the present disclosure may be implemented within methods, acts, systems, system elements and components using a variety of hardware, software or firmware configurations. Furthermore, aspects in accord with the present disclosure may be implemented as specially-programmed hardware and/or software. Referring to FIG. 8, there is illustrated a block diagram of one example of computing components forming a system 800 which may be configured to implement one or more aspects disclosed herein. For example, the system 800 may be configured to implement the measurement system 100 as illustrated and described above with reference to FIG. 1.

The system 800 may include for example a general-purpose computing platform such as those based on Intel PENTIUM-type processor, Motorola PowerPC, Sun Ultra-SPARC, Hewlett-Packard PA-RISC processors, or any other type of processor. System 800 may include specially-programmed, special-purpose hardware, for example, an application-specific integrated circuit (ASIC). Various aspects of the present disclosure may be implemented as specialized software executing on the system 800 such as that shown in FIG. 8.

The system 800 may include a processor/ASIC 806 connected to one or more memory devices 810, such as a disk drive, memory, flash memory or other device for storing data. Memory 810 may be used for storing programs and data during operation of the system 800. Components of the computer system 800 may be coupled by an interconnection mechanism 808, which may include one or more buses (e.g., between components that are integrated within a same machine) and/or a network (e.g., between components that reside on separate machines). The interconnection mechanism 808 enables communications (e.g., data, instructions) to be exchanged between components of the system 800. Further, in some embodiments the interconnection mechanism 808 may be disconnected during servicing of a PDU.

The system 800 also includes one or more input devices 804, which may include for example, a keyboard or a touch screen. An input device may be used for example to configure the measurement system or to provide input parameters. The system 800 includes one or more output devices 802, which may include for example a display. In addition, the computer system 800 may contain one or more interfaces (not shown) that may connect the computer system 800 to a communication network, in addition or as an alternative to the interconnection mechanism 808.

The system 800 may include a storage system 812, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 810 that allows for faster access to the information by the processor/ASIC than does the medium. This memory 810 may be a volatile, random access memory such as a dynamic random access memory (DRAM) or static memory (SRAM). It may be located in storage system 812 or in memory system 810. The processor 806 may manipulate the data within the integrated circuit memory 810 and then copy the data to the storage 812 after processing is completed. A variety of mechanisms are known for managing data movement between storage 812 and the integrated circuit memory element 810, and the disclosure is not limited thereto. The disclosure is not limited to a particular memory system 810 or a storage system 812.

The system 800 may include a general-purpose computer platform that is programmable using a high-level computer programming language. The system 800 may be also implemented using specially programmed, special purpose hardware, e.g. an ASIC. The system 800 may include a processor 806, which may be a commercially available processor such as the well-known Pentium class processor available from the Intel Corporation. Many other processors are available. The processor 806 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A power distribution unit (PDU) comprising:
    a housing including:
        an input configured to receive input power;
        a plurality of outputs each coupled to the input and configured to receive input power, and each output of the plurality of outputs having an output configured to provide output power;
        a plurality of output current sensors, each output current sensor of the plurality of output current sensors being coupled to a respective output of the plurality of outputs and being configured to detect output current provided by the respective output;
        a controller coupled to the plurality of output current sensors and configured to:
            determine a plurality of time intervals based on a frequency of the input power;
            receive, from each output current sensor of the plurality of output current sensors, a current value at each time interval of the plurality of time intervals for each output of the plurality of outputs;
            generate a plurality of current measurement sums, each current measurement sum of the plurality of current measurement sums being based on the received current values associated with a respective time interval of the plurality of time intervals;
            determine a root-mean-square (RMS) value based on the plurality of current measurement sums; and
            determine, based on the RMS value, an RMS current value of the input power; and
        a display coupled to the controller and configured to display the RMS current value of the input power.

2. The PDU of claim 1, wherein the PDU further comprises a first timer coupled to the controller, and wherein the controller is further configured to:
    reset the first timer responsive to detection of a zero crossing of a waveform of the input power; and
    determine the frequency of the input power based on a value of the first timer.

3. The PDU of claim 2, wherein the controller is further configured to associate the received current value to a time interval of the plurality of time intervals, the time interval being determined based on a scaled value of the first timer.

4. The PDU of claim 3, wherein each output of the plurality of outputs is sampled in a sequential fashion.

5. The PDU of claim 1, wherein the controller is further configured to average at least one current measurement of the plurality of current measurement sums with at least one previous current measurement using a leaky average technique.

6. The PDU of claim 1, wherein the PDU further comprises a memory, and wherein the controller is further configured to store the plurality of current measurement sums in the memory in a two-dimensional array, wherein a first dimension of the two-dimensional array is an index corresponding to a plurality of output values, and wherein a second dimension of the two-dimensional array corresponds to the plurality of time intervals.

7. The PDU of claim 6, wherein each time interval of the plurality of time intervals includes a measurement value pair, the measurement value pair including a measurement value and a status flag.

8. The PDU of claim 7, wherein the status flag is configured to indicate if a measurement has been sampled, and wherein the controller is further configured to:
    determine that a complete set of measurement values are available in the two-dimensional array based on a status of each status flag.

9. The PDU of claim 8, wherein each current measurement sum of the plurality of current measurement sums is based on summing a measurement value corresponding to each output of the plurality of outputs at a time interval.

10. The PDU of claim 8, wherein the RMS value approximates a current value for the input based on performing an RMS calculation using the plurality of current measurement sums.

11. A method for determining a root-mean-square (RMS) value for an input of a power distribution unit (PDU) having a housing including a display and a plurality of output current sensors each coupled to a respective output of a plurality of outputs, the method comprising:

- determining a plurality of time intervals based on a frequency of an input power provided to the input;
- measuring a current measurement value at each time interval of the plurality of time intervals for each output of the plurality of outputs;
- generating a plurality of current measurement sums, each current measurement sum of the plurality of current measurement sums being based on the current measurement values associated with a respective time interval of the plurality of time intervals;
- determining a root-mean-square (RMS) value based on the plurality of current measurement sums;
- determining, based on the RMS value, an RMS current value of the input power; and
- displaying the RMS current value of the input power on the display.

12. The method of claim 11, further comprising:
- resetting a first timer responsive to detection of a zero crossing of a waveform of the input power; and
- determining the frequency of the input power based on a value of the first timer.

13. The method of claim 12, the method further comprising associating the current measurement value for each output of the plurality of outputs to a time interval of the plurality of time intervals, the time interval being determined based on a scaled value of the first timer.

14. The method of claim 13, wherein measuring a current at each time interval of the plurality of time intervals for each output of the plurality of outputs further includes measuring each output of the plurality of outputs in a sequential fashion.

15. The method of claim 14, wherein determining the RMS value based on the plurality of current measurement sums further includes summing a measurement value corresponding to each output of the plurality of outputs at each time interval of the plurality of time intervals to derive the plurality of current measurement sums and performing an RMS calculation on the plurality of current measurement sums to approximate the RMS value for the input.

16. A non-transitory computer readable medium storing sequences of instructions executable by at least one processor, the sequences of instructions instructing the at least one processor to execute a process for determining a root-mean-square (RMS) value for an input of a power distribution unit (PDU), the PDU having a housing including a display and a plurality of output current sensors each respectively coupled to an output of a plurality of outputs, the sequences of instructions including instructions configured to:

- determine a plurality of time intervals based on a frequency of an input power;
- measure a current value at each time interval of the plurality of time intervals for each output of the plurality of outputs;
- generate a plurality of current measurement sums, each current measurement sum of the plurality of current measurement sums being based on the measured current values associated with a respective time interval of the plurality of time intervals;
- determine the RMS value based on the plurality of current measurement sums;
- determine, based on the RMS value, an RMS current value of the input power; and
- display the RMS current value of the input power on the display.

17. The non-transitory computer readable medium of claim 16, wherein the current is stored in a memory in a two-dimensional array, wherein a first dimension of the array is an index corresponding to an output of the plurality of outputs, and wherein a second dimension of the array corresponds to a time interval of the plurality of time intervals.

18. The non-transitory computer readable medium of claim 17, wherein the instructions are further configured to:
- determine a complete set of measurement values are available within the two-dimensional array;
- sum each measurement value of the complete set of measurement values to derive a plurality of current measurement sums corresponding to a time interval of the plurality of time intervals;
- store the plurality of current measurement sums in a composite waveform array; and
- determine the RMS value based on the composite waveform array.

* * * * *

UNITED STATES PATENT AND TRADEMARK OFFICE
CERTIFICATE OF CORRECTION

| | | |
|---|---|---|
| PATENT NO. | : 10,877,077 B2 | Page 1 of 1 |
| APPLICATION NO. | : 15/108016 | |
| DATED | : December 29, 2020 | |
| INVENTOR(S) | : Reinders et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 404 days.

Signed and Sealed this
Seventh Day of February, 2023

Katherine Kelly Vidal
*Director of the United States Patent and Trademark Office*